United States Patent [19]

Wei et al.

[11] Patent Number: 5,480,810
[45] Date of Patent: Jan. 2, 1996

[54] METHOD OF FABRICATING A RADIATION IMAGER WITH COMMON PASSIVATION DIELECTRIC FOR GATE ELECTRODE AND PHOTOSENSOR

[75] Inventors: Ching-Yu Wei; Roger S. Salisbury; Robert F. Kwasnick, all of Schenectady; Brian W. Giambattista, Scotia, all of N.Y.

[73] Assignee: General Electric Company, Schenectady, N.Y.

[21] Appl. No.: 384,093

[22] Filed: Feb. 6, 1995

Related U.S. Application Data

[62] Division of Ser. No. 261,592, Jun. 17, 1994, Pat. No. 5,435,608.

[51] Int. Cl.[6] .............................. H01L 21/84; H01L 21/31
[52] U.S. Cl. .................................. 437/2; 437/48; 437/51; 437/101; 437/904
[58] Field of Search ............................. 437/2, 3, 48, 50, 437/51, 101, 187, 904

[56] References Cited

U.S. PATENT DOCUMENTS

| | | | |
|---|---|---|---|
| 4,719,498 | 1/1988 | Wada et al. | |
| 5,075,244 | 12/1991 | Sakai et al. | 257/59 X |
| 5,233,181 | 8/1993 | Kwansnick et al. | 257/291 X |
| 5,274,250 | 12/1993 | Miyake et al. | 257/59 |
| 5,294,811 | 3/1994 | Aoyama et al. | 257/59 |
| 5,360,744 | 11/1994 | Shimizu et al. | 437/2 |
| 5,399,884 | 3/1995 | Wei et al. | 257/59 |
| 5,401,668 | 3/1995 | Kwasnick et al. | 437/3 |

FOREIGN PATENT DOCUMENTS

| | | |
|---|---|---|
| 63-174361 | 7/1988 | Japan. |
| 64-65867 | 3/1989 | Japan. |
| 3-149884 | 6/1991 | Japan. |

OTHER PUBLICATIONS

Kang–Chen Lin et al., "The Hydrogenated Amorphous Silicon Active Hollow Four Quadrant Orientation Detector for Application to Neural Network Image Sensors," IEEE Transactions on Electron Devices, vol. 41, No. 5, May 1994, pp. 666–670.

Primary Examiner—Mary Wilczewski
Attorney, Agent, or Firm—Donald S. Ingraham; Marvin Snyder

[57] ABSTRACT

A solid state radiation imager pixel having a thin film transistor (TFT) coupled to a photodiode in which the photodiode and the TFT each comprise a common dielectric layer, that is, a single dielectric layer that extends across the pixel and that has a gate dielectric layer portion and a photodiode body passivation portion. The common dielectric layer comprises a monolithic dielectric material such as silicon nitride or silicon oxide. Further, the bottom electrode of the photosensor body and the gate electrode are each disposed on a common surface of the substrate and comprise the same conductive material, the conductive material having been deposited on the pixel in the same deposition process. The source and drain electrodes and the common contact electrode for the photodiode each comprises the same source/drain metal conductive material, the conductive material having been deposited on the pixel in the same deposition process.

A method of fabricating an imager array includes, for each pixel in the array, the steps of depositing a first conductive layer on a substrate, forming a gate electrode and a photosensor bottom electrode from the first conductive layer, forming a photosensor body disposed on at least a portion of the photosensor bottom electrode, depositing a common dielectric layer over the gate electrode and over the photosensor body and exposed portion of the photosensor bottom electrode, and completing fabrication of the pixel TFT and the photosensor such that the TFT is electrically coupled to the respective photosensor. The portion of the common dielectric layer disposed over the gate electrode comprises the gate dielectric layer and the portion disposed over the photosensor body comprises the photosensor passivation layer.

9 Claims, 6 Drawing Sheets

METHOD OF FABRICATING A RADIATION IMAGER WITH COMMON PASSIVATION DIELECTRIC FOR GATE ELECTRODE AND PHOTOSENSOR

This application is a continuation of application Ser. No. 08/261,592, filed Jun. 17, 1994, now U.S. Pat. No. 5,435,608.

BACKGROUND OF THE INVENTION

This application relates to solid state radiation imagers having imaging pixels including a photosensor and a thin film transistor (TFT) for selectively coupling the photosensor to a data line, and in particular to such imagers having a common dielectric layer for the transistor and photosensor components and the method of fabricating such an imager, which method reduces the number of steps necessary to fabricate an imager array.

Solid state imagers typically include a photosensor array coupled to a scintillating medium. Radiation absorbed in the scintillator generates optical photons which in turn pass into a photosensor, such as a photodiode, in which the optical photon is absorbed and an electrical signal corresponding to the incident optical photon flux is generated. Substantially hydrogenated amorphous silicon (a-Si) is commonly used in the fabrication of photosensors due to the advantageous photoelectric characteristics of a-Si and the relative ease of fabricating such devices. In particular, photosensitive elements, such as photodiodes, can be formed in connection with necessary control or switching elements, such as thin film transistors (TFT's), in a relatively large array.

Imager and display arrays are typically fabricated on large substrates on which many components, including TFTs, address lines, and devices such as photosensors, am formed through the deposition and patterning of layers of conductive, semiconductive, and insulative materials. The array is comprised of pixels, with the address lines and associated TFTs being coupled together to enable the photosensor in each pixel of the array to be respectively addressed, so that, for example, the charge developed by each photosensor during a cycle of exposure to the incident radiation can be selectively read. The TFT fabrication process involves several patterning steps to produce the desired arrangement of a channel region between a source and a drain electrode with the desired arrangement of semiconductive material disposed between the electrodes and over the gate electrode. The TFT is electrically coupled to a respective photosensor, such as a photodiode, which is disposed to absorb incident photons and accumulate the resulting charge produced in the photodiode.

The conventional fabrication process for such an imaging array typically includes steps to first fabricate the TFT and then the photosensor. The steps of fabricating the TFT include the formation of a gate electrode; the formation of a TFT body, that is, the deposition of a gate dielectric layer followed by layers of semiconductive material (typically a-Si) and doped semiconductive material overlying the gate electrode and underlying the source and drain electrodes; and the formation of the source and drain electrodes with a channel region therebetween and formation of associated contacts to address lines (the various address lines are typically formed at the same time as the gate electrodes and source/drain electrodes are patterned). The TFT is then coated with a protective passivation coating prior to the fabrication of the photodiode. The a-Si for the photodiode body is then deposited and patterned; the presence of the protective passivation layer over the TFT assembly is necessary to ensure that a-Si portions of the TFT are not damaged by the patterning process for the photosensor island (as the etchants used to form the a-Si body would similarly etch TFT components if allowed to come in contact with such a-Si portions).

In the conventional array formation process, after formation of the photosensor island another passivation layer is deposited over the array to provide electrical insulation between the photosensor island (except at a predetermined contact area) and the common electrode of the photosensor array, which is disposed over the passivation layer. Further, the passivation layer over the photosensor passivates the a-Si based photosensor body and protects the a-Si photosensor from environmental conditions (such as moisture) that can degrade its performance and also protects the array from exposure to materials, such as solvents, used in remaining steps of the fabrication process. Typically a scintillator is disposed over the common electrode of the photosensor array to complete the imager structure. In the conventional fabrication process described above, formation of the complex imager structure requires as many as twelve photomasks, which is a relatively large number of processing steps for a thin film semiconductor structure (simpler liquid crystal displays, by contrast, are typically fabricated in processes requiring only about 5 masks). Each patterning step involving photomasking and etching increases the likelihood of inadvertent damage to the array from the processing and handling required and increases processing time, and thus it is desirable that fabrication processes have as few masking steps as feasible to achieve desired structures.

An object of this invention is to provide a method of fabricating an imager array having fewer fabrication steps and resulting in the elimination of several dielectric layers in the assembled array.

It is a further object of this invention to provide an imager having, in each pixel of the array, a structure with a single common dielectric layer comprising TFT gate dielectric and the photosensor island passivation.

SUMMARY OF THE INVENTION

A solid state radiation imager comprises a photosensor array disposed on a substrate, the array including a plurality of individually-addressable pixels. Each pixel includes a photosensor and a TFT coupled thereto so as to selectively electrically couple the photosensor to an address line in the array in correspondence with a voltage applied to a gate electrode in the TFT. In accordance with this invention, the photosensor, which is commonly a photodiode, and the TFT each comprise a common dielectric layer, that is, a single dielectric layer that extends across the pixel and has a gate dielectric layer portion disposed in the TFT and a photosensor body portion disposed over at least portions of the photosensor body. The common dielectric layer comprises a monolithic dielectric material such as silicon nitride or silicon oxide. Further, the bottom electrode on which the photosensitive material of the photosensor body is disposed, and the gate electrode are each disposed on a common surface of the substrate and comprise the same conductive material, the conductive material having been deposited on the pixel in the same deposition process. The source and drain electrodes and the common contact electrode for the photodiode each comprises the same conductive material, the conductive material having been deposited on the pixel in the same deposition process.

A method of fabricating an imager array includes, for each pixel in the array, the steps of depositing a first conductive layer on a substrate, forming a gate electrode and a photosensor bottom electrode from the first conductive layer, forming a photosensor body disposed on at least a portion of the photosensor bottom electrode, depositing a common dielectric layer over the gate electrode and over the photosensor body and exposed portions of the photosensor bottom electrode, and completing fabrication of the pixel TFT and the photosensor such that the TFT is electrically coupled to the respective photosensor. The portion of the common dielectric layer disposed over the gate electrode comprises the gate dielectric layer and the portion disposed over the photosensor body comprises the photosensor passivation layer. After depositing and patterning of semiconductive material layers to form the TFT body, a source/drain metal conductive layer is deposited over the TFT body and exposed portions of the common dielectric layer, and the source/drain metal conductive layer is then etched in a common etching sequence to form the source and drain electrodes for the TFT and the common electrode contact for the photosensor. The channel region of the TFT is formed by etching the n-type doped a-Si layer between the source and drain electrodes to complete the TFT. Typically a barrier layer of inorganic dielectric material is then deposited over the photosensor array.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
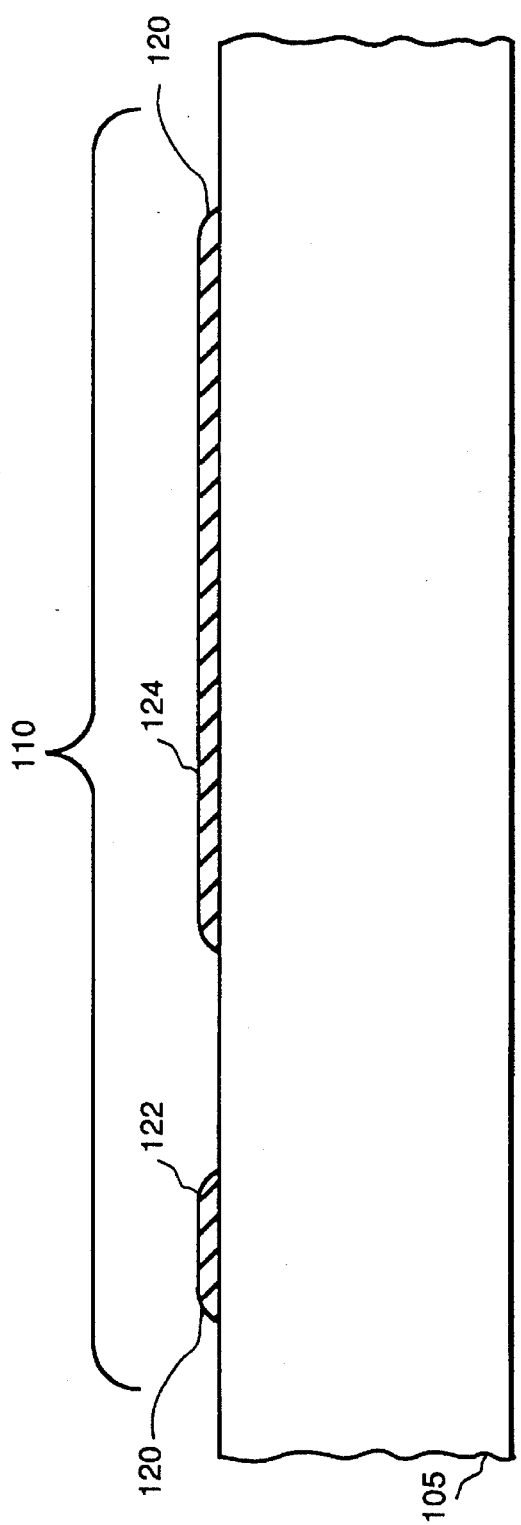
FIGS. 1(a) through 1(f) are cross-sectional views of a portion of a pixel of a radiation imager at sequential stages in the fabrication process in accordance with this invention.
Figure 1B:
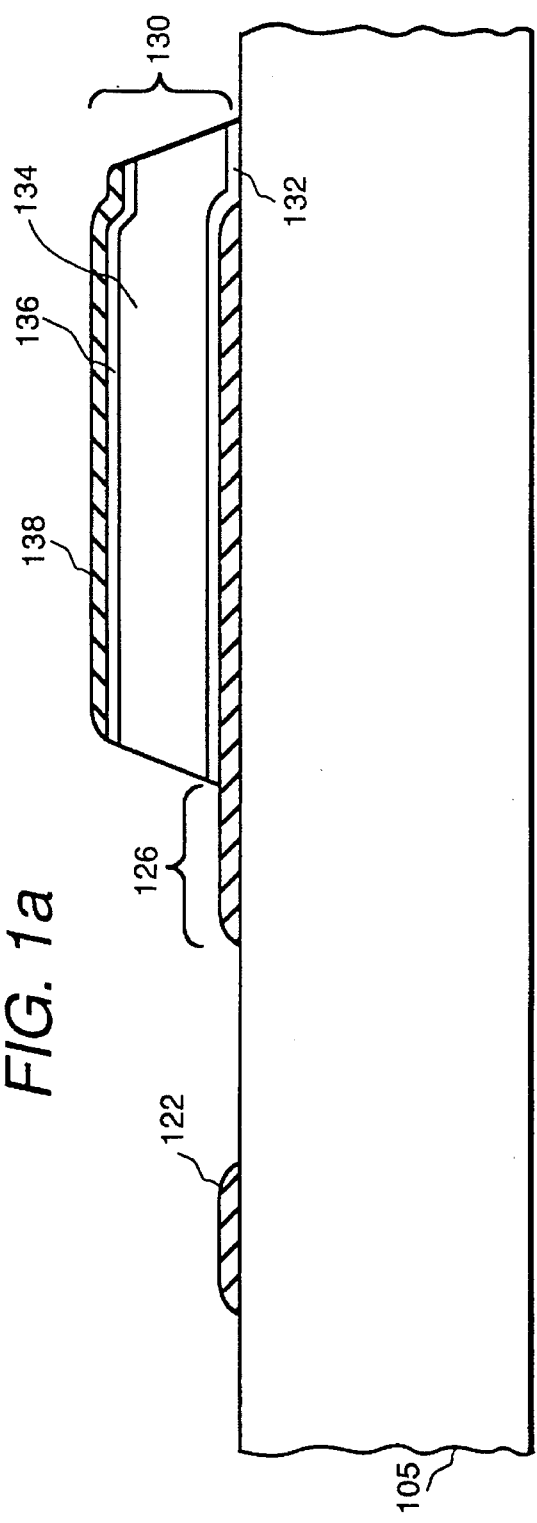
Figure 1C:
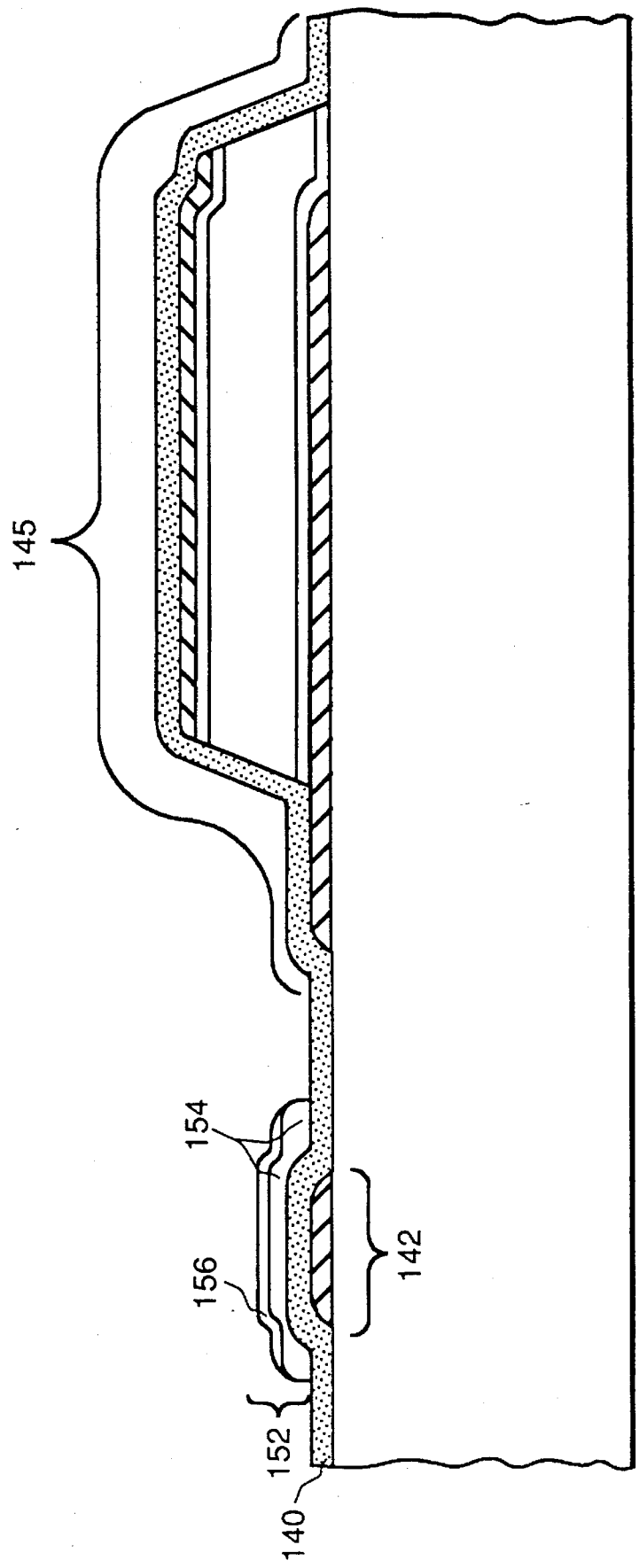
Figure 1D:
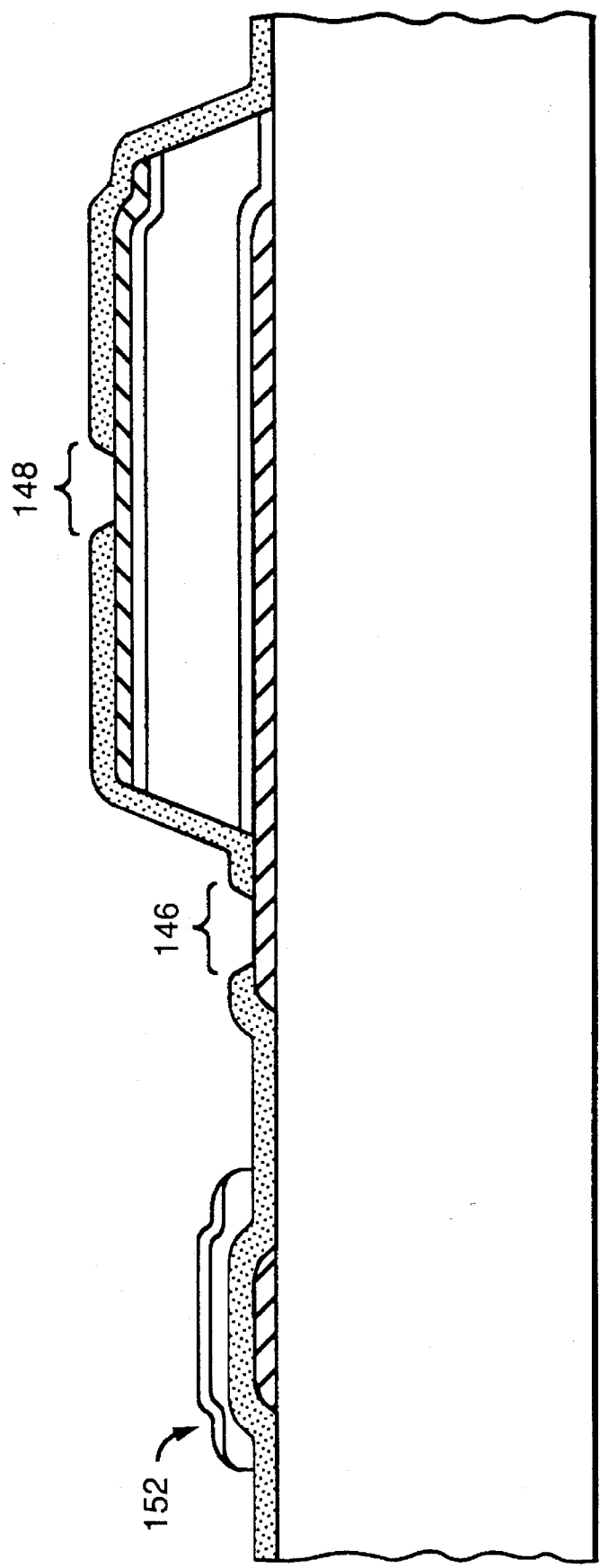
Figure 1E:
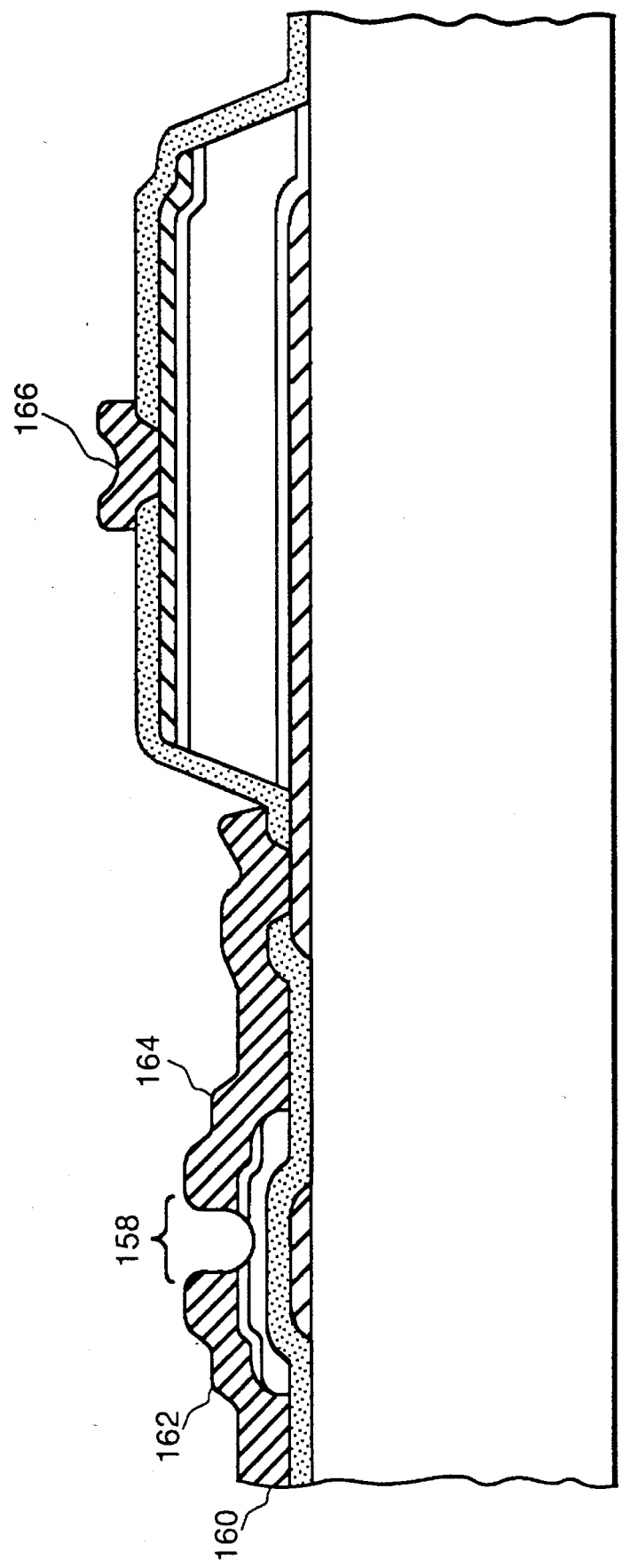
Figure 1F:
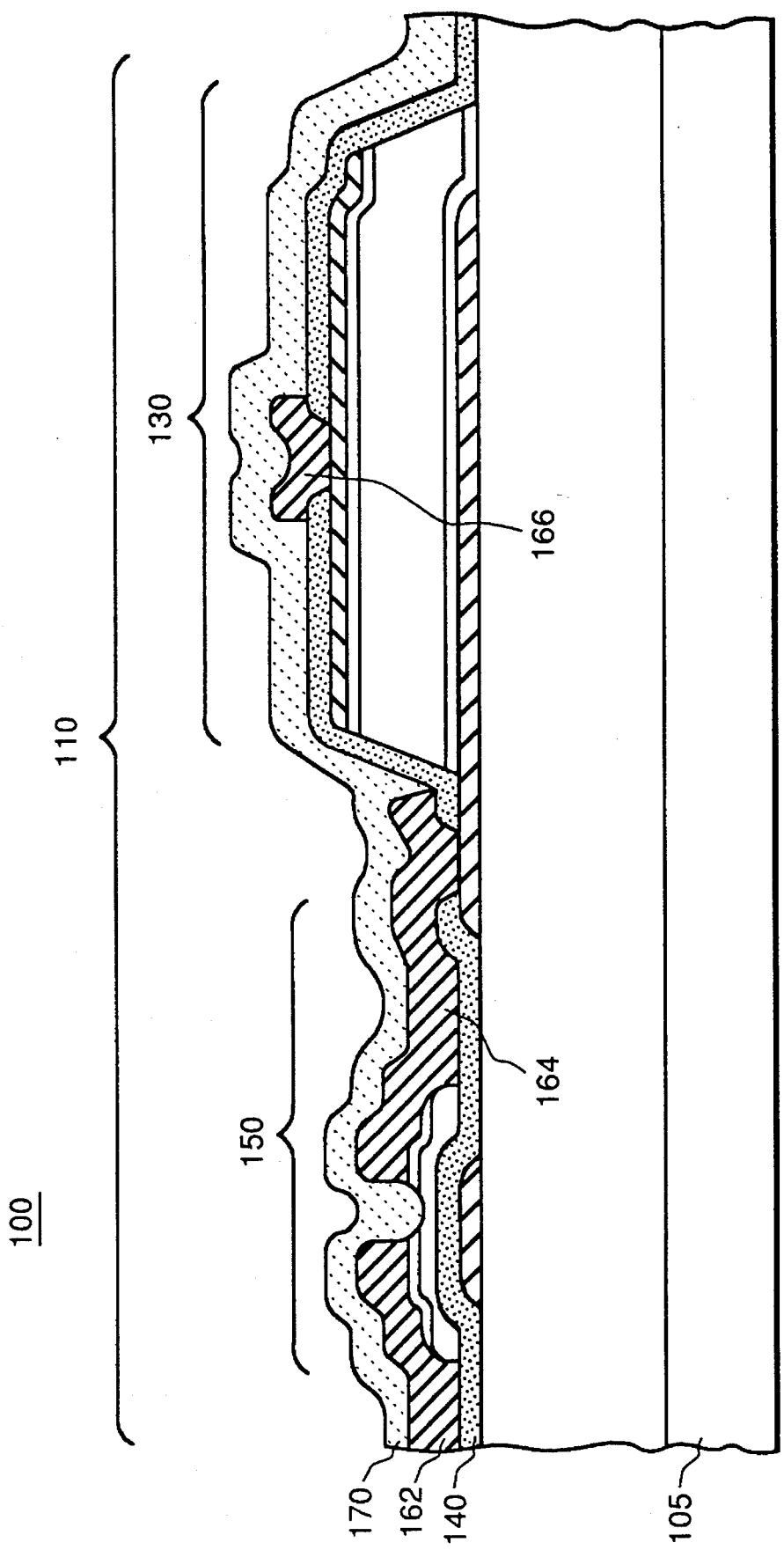

A radiation imager 100 (FIG. 1(f)) fabricated in accordance with this invention comprises a plurality of pixels 110 disposed on a substrate 105 (FIG. 1(a)). Imager, as used herein, refers to a solid state device that is adapted to absorb incident radiation of a particular wavelength (such as optical photons, x-rays, or the like) and generate an electrical signal corresponding to the absorbed radiation. Typically the pixels are disposed in an array having a pattern of rows and columns. As each pixel 110 is individually addressable, the spatial distribution of radiation absorbed by the array is also determinable. The photosensor array is electrically coupled to electrical circuits (not shown) situated off of the substrate; these circuits amplify and process the electrical signals generated by the array.

For purposes of illustration and not limitation, a representative pixel 110 is illustrated in the Figures herein and the accompanying description refers to such a representative pixel; typically, in accordance with known fabrication processes, fabrication of all pixels on substrate 105 that will form a particular imager photosensor array proceeds simultaneously.

In accordance with the method of this invention, a first conductive layer 120 is deposited on a surface of substrate 105 (a remaining portion of first conductive layer 120 is illustrated in FIG. 1(a)). A gate electrode 122 and a photosensor bottom electrode 124 are formed in a common etching sequence by etching first conductive layer 120 in accordance with a pattern (such as through an appropriately patterned photoresist mask) conforming to the desired positioning of gate electrode 122 and bottom electrode 124. As used herein, "common etching sequence" and the like refer to the coincident formation of components in the pixel, such as etching the underlying material to be formed into respective components in one set of etching steps through one patterned photoresist mask. Typically array scan lines 125 (FIG. 2) are also formed in the same common etching sequence. First conductive layer 120 (FIG. 1(a)) (and hence gate electrode 122 and bottom electrode 124) typically comprise metals such as chromium, titanium, molybdenum, aluminum, or the like, disposed in one layer, or alternatively, multiple layers, deposited to a thickness of between about 100 Å and 10,000 Å. Typically the upper surface of first conductive layer 120 comprises chromium or, alternatively, titanium because the a-Si of the photodiode can readily be etched selectively to these metals (the a-Si cannot readily be selectively etched with respect to molybdenum).

Figure 2:
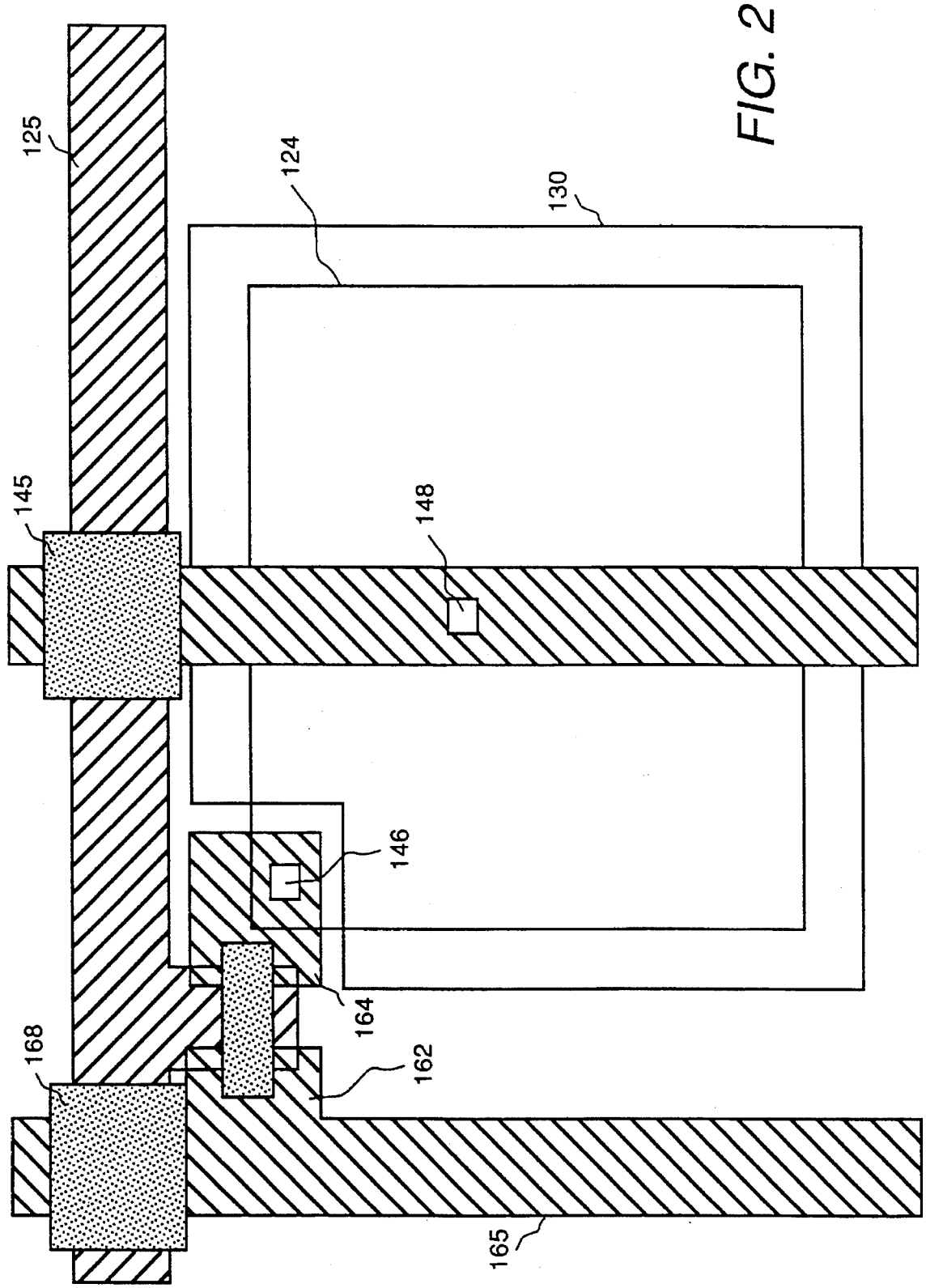
FIG. 2 is a schematic illustration of a representative pixel in a photosensor array completed in accordance with this invention.

In the fabrication of the array, the body of a photosensor 130 (also referred to as the photosensor island) is next formed on a portion of bottom electrode 124 so as to leave a bottom electrode finger portion 126 exposed (FIG. 1(b)). Photosensor 130 typically comprises a photodiode, as illustrated in the FIGS. While only a portion of photosensor island 130 is illustrated in FIG. 1(b), between about 50% and 85% of the area of pixel 110 on the surface of substrate 105 is occupied by photosensor island 130, as is illustrated in FIG. 2; to maximize the active, or photosensitive, area of the pixel, it is desirable that the portion of pixel occupied by photosensor island 130 be as large as possible consistent with other device constraints.

The formation of photosensor island 130 typically comprises the steps of depositing layers of photosensitive material and associated contact materials, such as an n+ amorphous silicon layer 132, a layer of intrinsic amorphous silicon (a-Si) 134, a p+ amorphous silicon layer 136, and a substantially transparent cap layer 138 (comprising indium tin oxide or the like). These materials are deposited over substrate 105, gate electrode 122, and bottom electrode 124, and then patterned to produce photosensor island 130. The patterning steps typically comprise forming a mask (not shown) on the cap layer (such as by depositing photoresist, exposing the photoresist in accordance with a desired pattern, and then processing the photoresist to remove portions thereof, leaving a mask having a selected pattern corresponding to the desired dimensions of photosensor island 130) and then etching the cap and the photosensor material so as to remove the undesired portions of the photosensitive material layers and form island 130. In another embodiment of this invention, the cap layer and photosensor island are patterned in separate masking steps in order to, for example, increase yield by bringing the cap layer slightly (e.g., 1 μm to 10 μm) inside of the photosensor island.

The etchant used in etching the silicon forming photosensor island 130 typically comprises either fluorine or chlorine, e.g., carbon tetrafluoride (CF$_4$), sulfur hexafluoride (SF$_6$), or hydrogen chloride gas (HCl); the cap is typically wet etched. The etchant is desirably selective to the material comprising gate electrode 122 and bottom electrode 124. Alternatively, a protective layer (not shown) comprising an inorganic dielectric material (such as silicon oxide) is deposited to a thickness of about 1000 Å over exposed portions of first conductive layer 120 prior to formation of the photosensor body. The protective layer is etched back in a photolithographic process from bottom electrode 124 portions of the first conductive layer prior to the formation of photosensor island 130; the remaining portions of the protective layer (e.g., over the gate electrode 122) form a portion of common dielectric layer 140, more fully described below.

In accordance with this invention, a common dielectric layer 140 is then deposited over pixel 110, covering gate electrode 122, exposed portions of substrate 105, exposed portions of photosensor bottom electrode 124, and photosensor island 130, as illustrated in FIG. 1(c). Common dielectric layer 140 typically comprises an inorganic dielectric layer such as silicon nitride, and is typically deposited in a plasma enhanced chemical vapor deposition (PECVD) process to a thickness of between about 0.05 µm to 0.5 µm. Common dielectric layer 140 is substantially monolithic, that is, it comprises material that is substantially uniformly disposed across the pixel area in a deposition process so that there are no intervening non-insulative materials between the passivation material and the covered components at different points on the array. In an alternative embodiment, if a protective layer (not shown) as described above is deposited over first conductive layer 120, common dielectric layer 140 overlies the remaining portions of the protective layer to form the inorganic dielectric insulative layer extending across the array. Further, common dielectric layer 140 conforms to the topography of the components already disposed on the pixel, that is, gate electrode 122, bottom electrode 124, and photosensor island 130, such that the thickness of common dielectric layer is substantially the same across the pixel (as used herein, substantially the same thickness refers to the layer thickness being within about plus or minus 10% of the nominal thickness). Common dielectric layer thus comprises a gate dielectric layer portion 142 and a photosensor passivation layer portion 144.

Next, and generally in the same PECVD pumpdown used for common dielectric layer deposition (or, without removing the wafer from the PECVD apparatus) a thin film transistor (TFT) body 152 is formed on gate dielectric portion 142 of common dielectric layer 140 (FIG. 1(c)). "TFT body", as used herein, refers generally to the semiconductive materials disposed on common dielectric layer gate dielectric portion 142 that will comprise part of the TFT in the assembled array. TFT body 152 comprises a semiconductor material layer 154 disposed over gate dielectric layer portion 142; the semiconductor material typically comprises amorphous silicon (a-Si) that is deposited in a chemical vapor deposition process to a thickness in the range between about 1500 Å and 5000Å. TFT body further comprises a doped semiconductor material layer 156 disposed over semiconductor material layer 154; doped semiconductor layer 156 typically comprises a-Si doped to exhibit n+ conductivity (e.g., having a conductivity greater than about $10^{-3}$ $(\Omega\text{-cm})^{-1}$ that is deposited in a PECVD process to a thickness in the range between about 300 Å and 1000 Å. Semiconductor material layer 154 and doped semiconductor material layer 156 are then patterned (e.g., etched in accordance with known procedures, such as photolithography) such that the layers extend over and slightly beyond gate electrode 122 as illustrated in FIG. 1(d) so as to form TFT body 152.

Additionally, a portion of the TFT island layer is typically left (that is, not etched away in the patterning process) at a crossover region 145 (FIG. 2) at the area where the photosensor common electrode, to be formed later in the process, will extend over scan line 125; this arrangement provides additional separation between the photosensor common electrode and scan line 125 (alternatively, only common dielectric layer 140 (and, alternatively, the underlying portions of protective layer, if used) is disposed between the common electrode and the scan line in crossover region 145). Portions of this layer also typically are disposed at scan/data line crossover region 168.

In one embodiment of the invention, if desired for protection of the doped semiconductive material, a relatively thin protective layer (not shown) is deposited over doped semiconductive material layer 156 prior to patterning. The relatively thin protective layer over doped semiconductive layer 156 typically comprises a metal selected to comprise the same metal as the immediate layer of the source-drain metal that is deposited thereover, as described below. After deposition of the overlying source-drain metal, the protective layer over the doped semiconductive material comprises part of the source-drain metal layer and is not readily distinguishable from the immediately adjacent source-drain metal.

Prior to deposition of source/drain metal on the pixel, a photosensor bottom electrode via 146 and a photosensor common contact via 148 are formed in common dielectric layer 140 (FIG. 1(d)). These vias are formed in a common etching sequence to provide access through a portion of common dielectric layer 140 (i.e., the via is surrounded on all sides by remaining portions of the common dielectric layer) such that electrical contact can be made to the underlying components. Typically, the vias in the common dielectric layer each have an area of at least about 3 µm by 3 µm.

A source/drain metal conductive layer is then deposited over pixel 110 (FIG. 1(e)). Source/drain metal conductive layer typically comprises molybdenum, aluminum, or the like that is deposited in a sputtering process to a thickness in the range between about 2000 Å and 10000 Å. In accordance with this invention, source/drain metal conductive layer 160 is then patterned in a common etching sequence to form a drain electrode 162, a source electrode 164, and a photosensor common electrode 166. Typically, photosensor array data lines 165 (FIG. 2) are also formed from source/drain metal conductive layer 160 in the same common etching process. Drain electrode 162 is disposed over a first portion of TFT body 152 and is coupled to a respective address line 165. Source electrode 164 is disposed over a second portion of TFT body 152 (FIG. 1(e)), portions of common dielectric layer 140, and in bottom electrode via 146 so as to electrically couple the TFT to photodiode 130. Photosensor common electrode 166 is disposed over at least a portion of common dielectric layer 140 covering photosensor island 130 and over a portion of common dielectric layer not covering the photosensor island (e.g., the portion that crosses scan line 125 as illustrated in FIG. 2) and into photosensor common contact via 146.

As photosensor common contact 166 comprises the same metal as the source and drain electrodes, the conductive material used is typically not light transmissive (e.g., opaque or translucent) and thus the width of common contact 166 is desirably kept small in order to minimize light blockage in the active area (photosensitive area) of photodiode 130 (common electrode 166 extends between respective pixel common contact vias 148 and biasing voltage contacts on the edges of the array (FIG. 2)). In an array having pixel side lengths in the range between about 50 µm and 400 µm, typical widths of common electrode 166 are in the range between about 3 µm and 15 µm.

A channel region 158 (FIG. 1(e) is then formed between source and drain electrodes 162, 164, typically by etching away the doped semiconductor layer exposed between the electrodes, and a small (e.g., <1500 Å,) portion of the intrinsic a-Si underlying the removed doped semiconductor layer. Formation of the channel region completes fabrication of TFT 150.

To complete fabrication of pixel 110, a barrier layer 170 (FIG. 1(f))is deposited over the array to passivate and seal the array from environmental conditions (such as moisture). Barrier layer 170 is patterned to expose at least contact fingers outside the array (not shown) so that connections can be made between the array and circuits off the array wafer. As illustrated in FIG. 1(f), the photosensor array of the imager fabricated in accordance with this invention thus comprises a plurality of pixels, each of which has a TFT 150 coupled to a photodiode 130. In each pixel, common dielectric layer comprises both the TFT gate dielectric layer and the photosensor island passivation layer. Further, the gate electrode and the photosensor bottom electrode each are disposed on the substrate surface and each comprises the same metal, having been deposited in the same deposition of conductive material. Source and drain electrodes 162, 164, and photodiode common electrode 166 each comprise the same conductive material, having been deposited on the pixel in the same deposition process.

The structure of the present invention has two fewer passivation layers than previous solid state imager arrays (in the conventional array, there is a gate dielectric layer, a TFT passivation layer, a diode passivation layer, and a barrier layer over the array; the array of the present invention comprises the common dielectric layer and the array barrier layer). In the conventional array, the TFT fabrication is completed prior to the formation of the photosensor islands, thus necessitating a separate passivation layer deposited over the TFT alone to protect it during the fabrication of the photosensor islands. In the pixel of the present invention, the single common dielectric layer 140 provides both the TFT gate dielectric layer and a photosensor passivation layer, obviating the need for separate TFT and photosensor passivation layers.

From a process standpoint, several patterning steps are saved. For example, TFT gate electrode 122 and photosensor bottom electrode 124 are etched in a common etching sequence, as opposed to being etched at separate times, as in the conventional process. Further, formation of source and drain electrodes and photosensor common electrode are also accomplished in a common etching sequence, saving the separate respective patterning steps for the TFT electrodes and the photosensor common electrode as required by the conventional process. In the fabrication of solid state imagers, the reduction in the number of fabrication steps increases yield of the fabrication process, which saves resources. The reduced number of steps reduces handling and etching of the wafer, reducing the chance for damage to be done in the fabrication process.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method of fabricating an imager array having a plurality of pixels, each pixel comprising a respective pixel thin film transistor and pixel photosensor, the method comprising, for each respective pixel, the steps of:

depositing a first conductive layer on a substrate;

forming a gate electrode and a photosensor bottom electrode from said first conductive layer;

forming a photosensor body disposed on at least a portion of said photosensor bottom electrode;

depositing a common dielectric layer over said gate electrode so as to form a gate dielectric, and over said photosensor body and exposed portions of said photosensor bottom electrode so as to form a photosensor passivation layer, said common dielectric layer comprising a monolithic dielectric material; and completing fabrication of said pixel TFT and said pixel photosensor such that said pixel TFT's electrically are coupled to the respective pixel photosensor.

2. The method of claim 1 wherein the step of completing fabrication of said pixel TFT and said pixel photosensor further comprises the steps of:

forming a TFT body on said common dielectric layer in a spaced relationship with said gate;

forming respective source and drain electrodes on said TFT body, one of said electrodes being disposed in electrical contact with said photosensor bottom electrode; and forming a photosensor common electrode disposed on at least a portion of said common dielectric layer and coupled to said photosensor body.

3. The method of claim 2 wherein the steps of forming said source and drain electrodes and said common electrode further comprise the steps of:

depositing a source/drain metal conductive layer over said TFT body and exposed portions of said common dielectric layer; and etching said source/drain metal conductive layer in accordance with a selected pattern so as to form said source and drain electrodes and said photosensor common electrode in a common etching sequence.

4. The method of claim 3 further comprising the step of forming a photosensor bottom electrode via and a photosensor common contact via in said common dielectric layer prior to the deposition of said source/drain metal conductive layer, the formation of said vias being accomplished with the use of one patterning mask and one dig down step to remove the common dielectric layer material so as to form said vias.

5. The method of claim 3 further comprising the step of etching a channel region in said TFT body, said channel region being disposed over said gate electrode and between said source and drain electrodes.

6. The method of claim 3 further comprising the step of depositing a common barrier passivation layer over said pixel such that said common barrier layer covers both said completed pixel TFT and the completed pixel photosensor.

7. The method of claim 1 further comprising the step of forming a protective layer over exposed portions of said first conductive layer prior to formation of said photosensor body, said protective layer comprising an inorganic dielectric material.

8. The method of claim 1 further comprising the step of forming a scan line from said first conductive layer, said scan line being coupled to said gate electrode.

9. The method of claim 3 further comprising the step of forming an address line from said source/drain metal conductive layer, said address line being electrically coupled to said respective TFT.

* * * * *